United States Patent
Ellis-Monaghan et al.

(10) Patent No.: US 9,941,300 B2
(45) Date of Patent: Apr. 10, 2018

(54) STRUCTURE AND METHOD FOR FULLY DEPLETED SILICON ON INSULATOR STRUCTURE FOR THRESHOLD VOLTAGE MODIFICATION

(71) Applicant: GLOBALFOUNDRIES INC., Grand Cayman, KY (US)

(72) Inventors: John Joseph Ellis-Monaghan, Grande, VT (US); Terence B Hook, Jericho, VT (US); Kirk David Peterson, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/970,725

(22) Filed: Dec. 16, 2015

(65) Prior Publication Data

US 2017/0179156 A1    Jun. 22, 2017

(51) Int. Cl.
*H01L 27/12* (2006.01)
*H01L 29/06* (2006.01)
(Continued)

(52) U.S. Cl.
CPC .... *H01L 27/1203* (2013.01); *H01L 21/76283* (2013.01); *H01L 21/84* (2013.01);
(Continued)

(58) Field of Classification Search
CPC .............................. H01L 27/1203; H01L 27/11
See application file for complete search history.

(56) References Cited

U.S. PATENT DOCUMENTS

| 6,252,275 B1 | 6/2001 | Aitken et al. |
| 7,195,978 B2 | 3/2007 | Hofmann et al. |

(Continued)

FOREIGN PATENT DOCUMENTS

| JP | 2003152192 A | 5/2003 |
| JP | 2006086206 A | 3/2006 |
| KR | 100894683 B1 | 4/2009 |

OTHER PUBLICATIONS

"Hybrid Silicon Nanocrystals/SiN Charge Trapping Layer with High-k Dielectrics for FN and CHE Programming", Gay at al.: VLSI Technology Systems and Applications (VLSI-TSA), 2010 International Symposium on, Apr. 26-28, 2010, p. 54-55.
(Continued)

*Primary Examiner* — Dale E Page
*Assistant Examiner* — Wasiul Haider
(74) *Attorney, Agent, or Firm* — Yuanmin Cai; Hoffman Warnick LLC (57) ABSTRACT

A method for fabricating a fully depleted silicon on insulator (FDSOI) device is described. A charge trapping layer in a buried oxide layer is provided on a semiconductor substrate. A backgate well in the semiconductor substrate is provided under the charge trapping layer. A device structure including a gate structure, source and drain regions is disposed over the buried oxide layer. A charge is trapped in the charge trapping layer. The threshold voltage of the device is partially established by the charge trapped in the charge trapping layer. Different aspects of the invention include the structure of the FDSOI device and a method of tuning the charge trapped in the charge trapping layer of the FDSOI device.

15 Claims, 11 Drawing Sheets

(51) Int. Cl.
*H01L 29/66* (2006.01)
*H01L 21/762* (2006.01)
*H01L 27/11* (2006.01)
*H01L 21/84* (2006.01)
*H01L 21/66* (2006.01)
*H01L 29/10* (2006.01)

(52) U.S. Cl.
CPC .............. *H01L 22/20* (2013.01); *H01L 27/11* (2013.01); *H01L 29/0649* (2013.01); *H01L 29/1087* (2013.01); *H01L 29/66568* (2013.01)

(56) References Cited

U.S. PATENT DOCUMENTS

| | | | |
|---|---|---|---|
| 7,973,364 B2 | 7/2011 | Krivokapic | |
| 8,883,624 B1* | 11/2014 | Ramkumar | H01L 21/28282 257/E21.423 |
| 8,963,228 B2 | 2/2015 | Chou et al. | |
| 9,153,309 B2 | 10/2015 | Widjaja et al. | |
| 2004/0041206 A1* | 3/2004 | Bhattacharyya | H01L 29/66833 257/326 |
| 2006/0186456 A1 | 8/2006 | Burnett et al. | |
| 2006/0263981 A1 | 11/2006 | Forbes | |
| 2007/0138555 A1 | 6/2007 | Bhattacharyya | |
| 2009/0302365 A1* | 12/2009 | Bhattacharyya | B82Y 10/00 257/298 |
| 2011/0220805 A1* | 9/2011 | Gordon | H01L 31/119 250/370.09 |
| 2014/0264554 A1* | 9/2014 | Lim | H01L 29/66833 257/326 |
| 2015/0097212 A1* | 4/2015 | Morin | H01L 29/785 257/192 |
| 2016/0172438 A1* | 6/2016 | Jelinek | H01L 22/20 257/493 |

OTHER PUBLICATIONS

"UTBOX SOI Substrate with Composite Insulating Layer", Landru et al., ECS Journal of Solid state Science and Technology, 2(6) Q83-Q87 (2013).

"Charge trapping memory structures with Al2O3 trapping dielectric for high-temperature applications", Specht et al., Solid State Electronics, vol. 49, Issue 5, May 2005, p. 716-720.

* cited by examiner

STRUCTURE AND METHOD FOR FULLY DEPLETED SILICON ON INSULATOR STRUCTURE FOR THRESHOLD VOLTAGE MODIFICATION

BACKGROUND OF THE INVENTION

This disclosure relates to integrated circuit devices, and more specifically, to a fully depleted silicon on insulator structure for random access memory and a method to produce the structure.

Fully depleted silicon on insulator, or FDSOI, also known as ultra-thin or extremely thin silicon-on-insulator (ET-SOI), is a planar process technology that reduces silicon geometries while simplifying the manufacturing process. In FDSOI, an ultra-thin layer of insulator, called a buried oxide (BOX) layer, is positioned on top of the base silicon. Then, a very thin silicon film is used to implement the transistor channel. Due to how thin the silicon layer is, there is no need to dope the channel, thus making the transistor "fully depleted". The benefits of backgate biasing in FDSOI are well known. Backgate biasing can dynamically alter the threshold voltage, speeding up or reducing the leakage of circuits on the fly. Biasing can also be used to adjust for process variations and fine-tune circuit operation, especially in static random-access memory.

Random-access memory (RAM) is a form of computer data storage. Non-volatile random-access memory (NVRAM) is a type of random-access memory that retains its information when power is turned off, therefore the name "non-volatile". This is in contrast to other types of RAM such as dynamic random-access memory (DRAM) and static random-access memory (SRAM), which both maintain data only for as long as power is applied.

BRIEF SUMMARY

According to this disclosure, a structure and method for constructing the structure are described. In one aspect of the invention, a method for fabricating a fully depleted silicon on insulator (FDSOI) device is described. A charge trapping layer in a buried oxide layer is provided on a semiconductor substrate. A backgate well in the semiconductor substrate is provided under the charge trapping layer. A device structure including a gate structure, source and drain regions is disposed over the buried oxide layer. A charge is trapped in the charge trapping layer. The threshold voltage of the device is partially established by the charge trapped in the charge trapping layer. Different aspects of the invention include the structure of the FDSOI device and a method of tuning the charge trapped in the charge trapping layer of the FDSOI device.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, the invention includes a structure and method for a fully depleted silicon on insulator (FDSOI) transistor in which the effective backgate voltage may be permanently or semi-permanently established in selected regions of the chip. One drawback of the prior art technique for maintaining a bias on the backgate is the requirement to actively provide the requisite voltages to the wells, which requires pump circuits which expend power and require chip area. In the invention, a charge-trapping layer is incorporated in at least some portion of the thin BOX region of the FDSOI device. The charge trapping layer can be comprised of silicon nodules, a silicon nitride or alumina layer, or a region of implant-damaged oxide. By trapping electrons in the BOX layer, the device operation is improved without resorting to the pump circuits of the prior art. Further, the operating center point for pump voltages may be adjusted for improved operation and/or additional threshold voltages may be provided beyond those available from other options such as front gate and backgate work functions.

The structure and operation may be adapted for usage as a non-volatile SRAM cell.

A "substrate" as used herein can comprise any material appropriate for the given purpose (whether now known or developed in the future) and can comprise, for example, Si, SiC, SiGe, SiGeC, Ge alloys, GaAs, InAs, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures. The sidewall structures can be used as masking structures for further semiconducting processing steps.

In the prior art for NVRAM cells, the charge is trapped in a layer which can be a floating silicon, or some other trapping layer between a control gate and the channel. Sensing is accomplished by applying a moderate voltage on the control gate. Charging and discharging can be accomplished by applying a larger voltage on the control gate relative to the source potential. In the prior art for FDSOI, backgate biasing the backgate potential is either ground or Vdd (which is a very limiting range) or provided by a pump, which takes area and burns power.

In this invention, charge is trapped in a charge trapping layer below the channel in a buried oxide layer. Charging and discharging the charge trapping layer is accomplished by applying a voltage on the bottom gate relative to the source potential. In embodiments of the invention used in an NVRAM cell, sensing is accomplished by applying a moderate voltage on the top gate.

In the case of conventional logic or 6T SRAM the operation of the circuit is standard, except that unique potentials need not be actively supplied to the backgates. While the invention is described in reference to a particular FDSOI device configuration, the invention can be used with other FDSOI configurations as would be understood by those skilled in the art.

Embodiments will be explained below with reference to the accompanying drawings.

Figure 1:
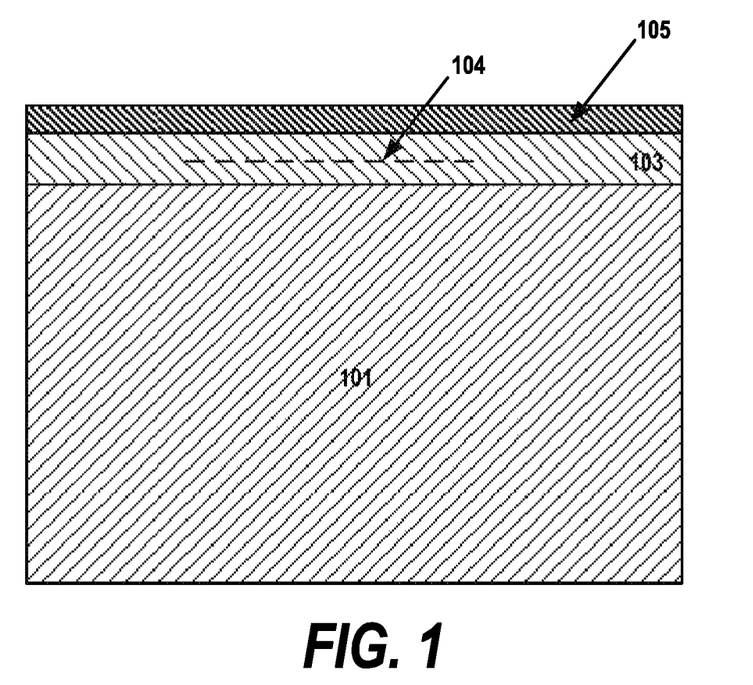
FIG. 1 is a cross-sectional diagram of a standard starting substrate including a Buried Oxide (BOX) layer used in a first embodiment of the invention.

FIG. 1 is a cross-sectional diagram of a standard starting substrate including a Buried Oxide (BOX) layer used in a first embodiment of the invention. As shown in FIG. 1, buried oxide layer (BOX) 103 is disposed over bulk substrate 101. In preferred embodiments of the invention, the bulk substrate 101 is silicon. A thin silicon layer 105 is disposed over buried oxide layer 103. BOX layer 103 is comprised silicon oxide and has a thickness for example, between 20.0 nanometers (nm) and 50.0 nm. Thin silicon layer 105 has a thickness, for example, between 5.0 nm and 15.0 nm. In embodiments of the invention of an FD SOI device, an FD SOI NMOS device or FDSOI PMOS device is fabricated.

Within BOX layer 103 a charge-trapping layer 104 is incorporated. Several different types of charge trapping material can be used in different embodiments of the invention. The charge trapping layer can be comprised of silicon nodules, a silicon nitride or alumina layer, or a region of implant-damaged oxide. The trapping layer 104 can be located asymmetrically within the BOX layer 103 so as to allow tunneling into and out of the layer from one of the electrodes. By trapping electrons in the BOX layer 103, the device operation is improved without resorting to the pump circuits of the prior art.

Creating the charge trapping layer 104 can be accomplished in several ways. For example, where the charge trapping layer is comprised of silicon nodules, a silicon nitride or alumina, the charge trapping material can be selectively deposited over a bulk silicon substrate 101 and a first portion of dielectric layer 103. Then, a remaining portion of the dielectric layer 103 and then the thin silicon layer 105 is deposited. The selective deposition of the charge trapping material can be accomplished through the use of a masking layer such as a photoresist layer. The deposition of the remaining portion of the dielectric layer 103 and the thin silicon layer 105 can be accomplished by a wafer bonding process. In an alternate embodiment, silicon may be selectively implanted into the dielectric layer 103, which creates charge-trapping states. In yet another embodiment, the charge trapping layer is uniform across the chip and the charge trapping layer is divided by the use of isolation layers, e.g. shallow trench isolation (STI).

Figure 2:
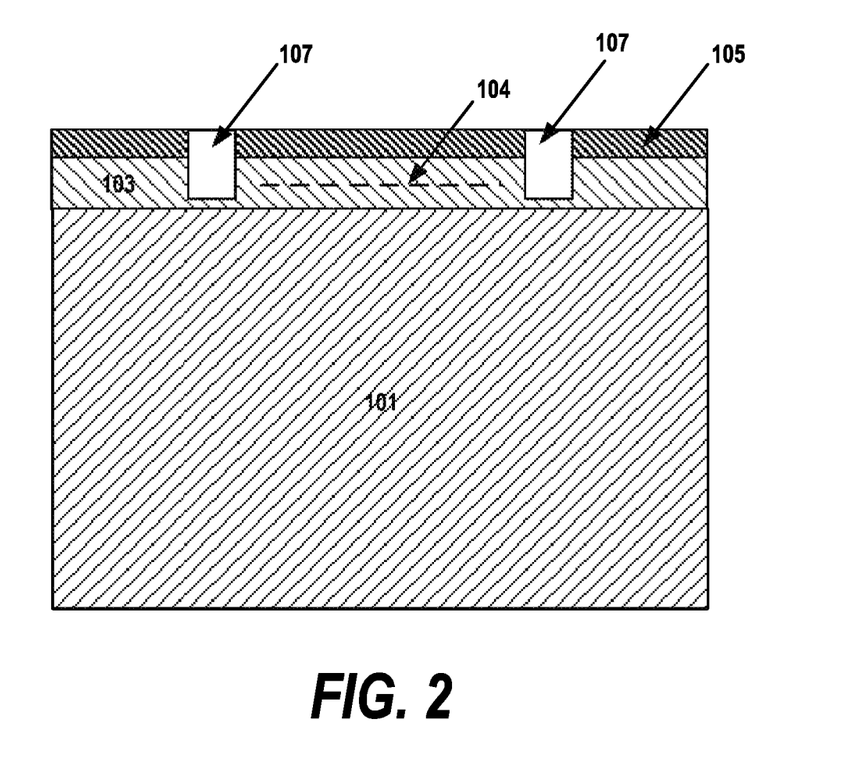
FIG. 2 is a cross-sectional diagram depicting the structure after an isolation etch and a dielectric fill layer has been deposited according to a first embodiment of the invention.

FIG. 2 is a cross-sectional diagram depicting the structure after an isolation etch and a dielectric fill layer have been deposited according to a first embodiment of the invention. As shown in the drawing, isolation areas 107 have been defined in thin silicon layer. Isolation areas 107 can comprise silicon oxide and can be, for example, shallow trench isolation (STI) trenches. The STI process uses a pattern of etched trenches in the silicon, deposits one or more dielectric materials (such as silicon dioxide or flowable oxide) to fill the trenches, and removes the excess dielectric using a technique such as chemical-mechanical polishing (CMP). In preferred embodiments of the invention, the STI trench and isolation 107 extends below the level of the charge trapping layer 104.

Figure 3:
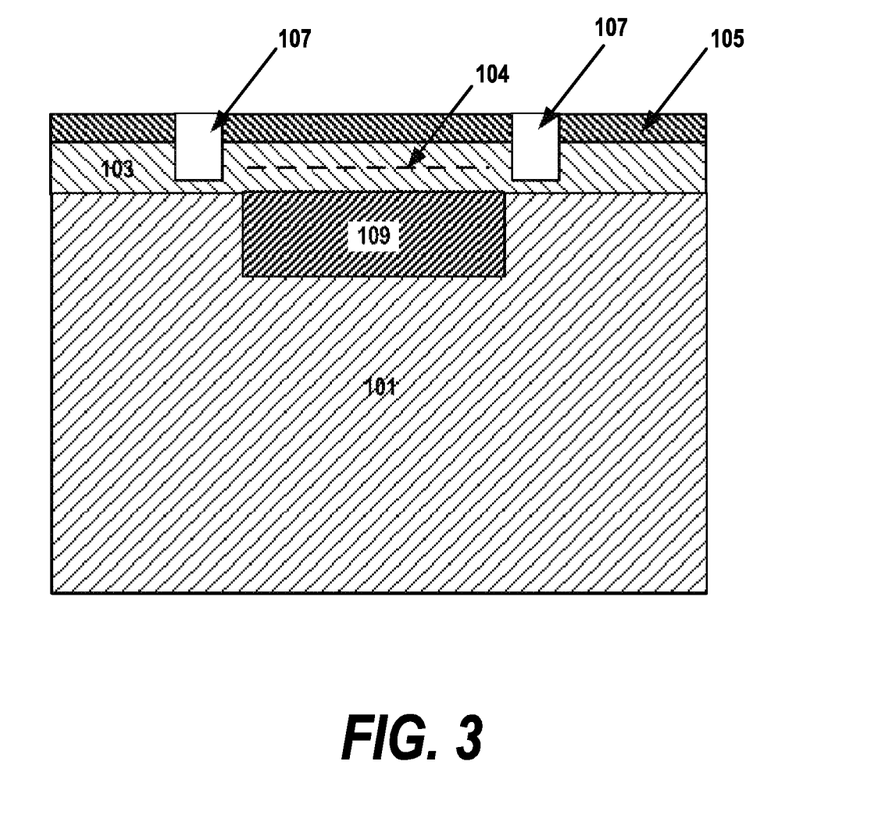
FIG. 3 is a cross-sectional diagram showing the structure after a backgate implant and formation process according to a first embodiment of the invention.

FIG. 3 is a cross-sectional diagram showing the structure after a backgate implant and formation process according to a first embodiment of the invention. The backgate 109 is a region of the base silicon substrate 101 that is adjacent to the BOX layer 105 and has been doped by means of an implant process at the substrate/BOX interface. The type of ion used in the implant step is dependent on the backgate electric characteristics desired for the completed device. For example, a p-type backgate implant can use a boron ion (B+) as the dopant. An n-type backgate implant can use a phosphorous ion (P+) as the dopant. Typically, the concentration of the dopant in the backgate should be larger than about 1e18 cm−3 to prevent excessive depletion, and the peak of the implant should be located just below the BOX layer. The backgate implant is followed by annealing step to form the backgate well region 109.

Figure 4:
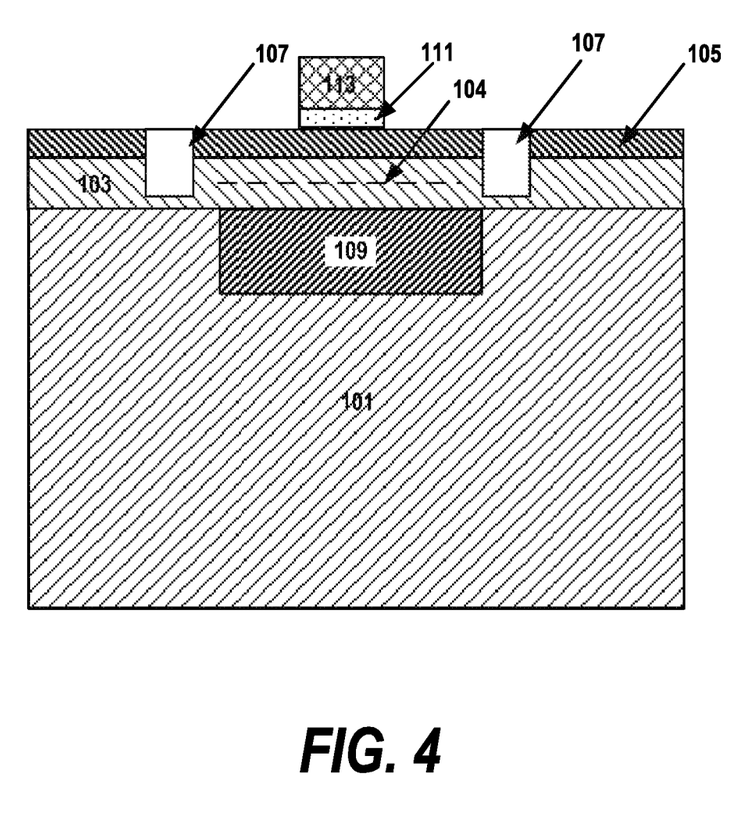
FIG. 4 is a cross-sectional diagram depicting the structure after the gate dielectric and gate formation according to a first embodiment of the invention.

FIG. 4 is a cross-sectional diagram depicting the structure the gate dielectric and gate formation according to a first embodiment of the invention. As shown in FIG. 4, gate dielectric 111 is formed over the channel region of silicon layer 105. In preferred embodiments of the invention, the gate dielectric 111 is a layer of hafnium oxide (HfO2), hafnium silicate, hafnium silicon nitride or other suitable high-k material. Other embodiments of the invention use silicon dioxide or other suitable dielectric material as the gate dielectric. The gate stack 113 can be comprised of a conductive material as polysilicon or a metal layer, or a combination of conductive materials. In preferred embodiments of the invention, the gate stack 113 of the device is from 20-30 nm in height.

Figure 5:
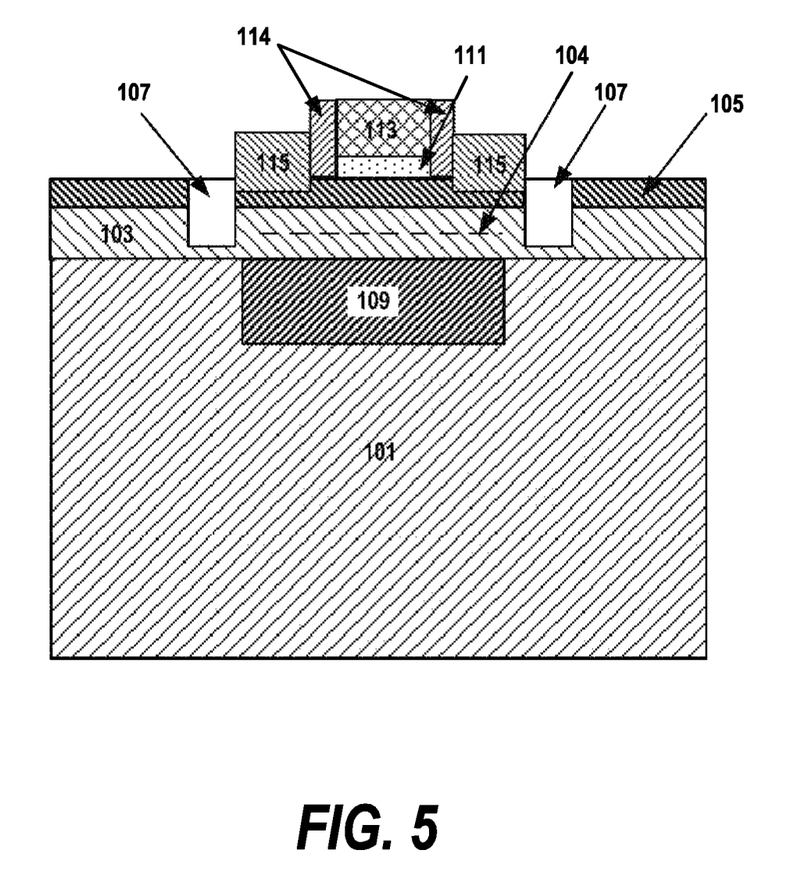
FIG. 5 is a cross-sectional diagram depicting the structure after spacer deposition and raised source and drain formation according to a first embodiment of the invention.

FIG. 5 is a cross-sectional diagram depicting the structure after spacer deposition and raised source and drain formation according to a first embodiment of the invention. Spacers 114 are situated adjacent to opposite sides of the gate dielectric 111 and gate stack 113. Spacers 114 can be comprised of silicon nitride (SiN) or other suitable dielectric material and can be formed using a sidewall process in a manner known to the art. The raised source and drain regions 115 are situated adjacent to opposite sides of the spacers 114. The raised source and drain (RSD) regions 115 can be created by an epitaxial step to grow crystalline silicon over the channel area in the source and drain regions using low pressure chemical vapor deposition (LPCVD) or other processes known to those skilled in the art. The SiN spacers 114 and the STI regions 107 bound the epitaxial growth process to the source and drain regions of the thin silicon layer 105. In preferred embodiments of the invention, the RSD regions 115 of the device are from 20-30 nm in height.

Figure 6:
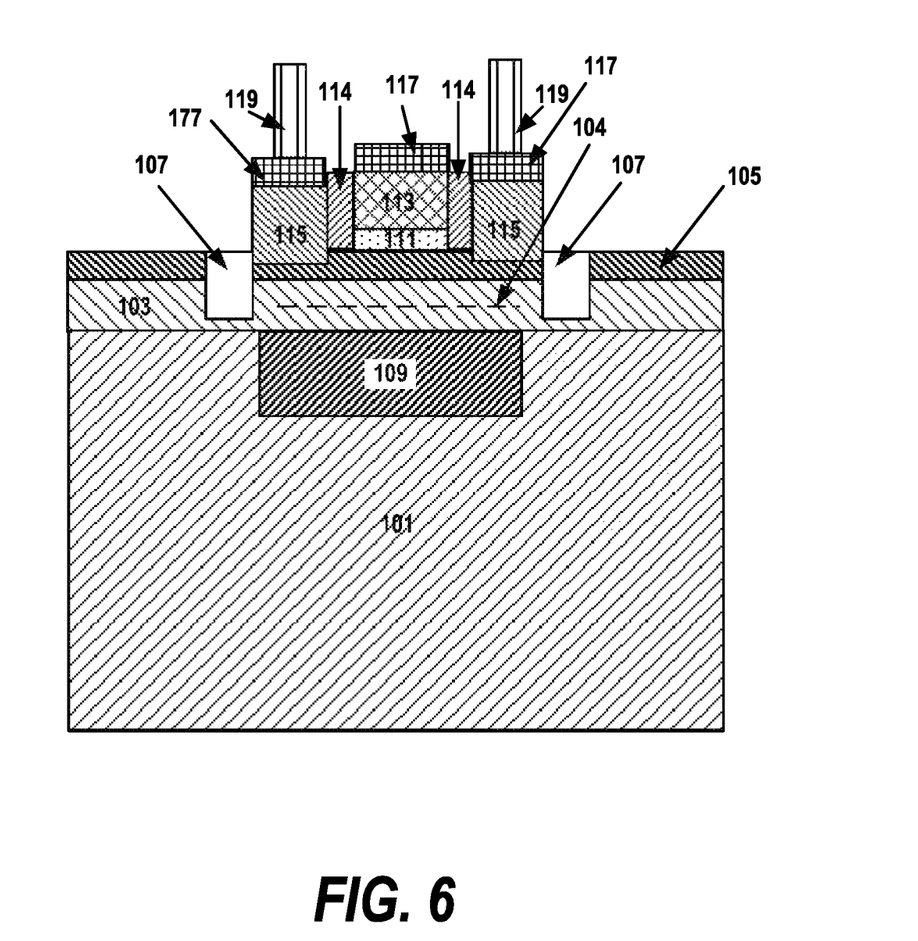
FIG. 6 is a cross-sectional diagram depicting the structure after silicide and contact formation according to a first embodiment of the invention.

FIG. 6 is a cross-sectional diagram depicting the structure after silicide and contact formation according to a first embodiment of the invention. A silicide on the gate, source and drain regions is commonly formed with photolithography mask followed by the deposition of a metal selectively onto the top of the gate stack 113 and RSD regions 115. This step is followed by an anneal performed at low temperature (for example, less than about 450° C.) to form silicide layer 117 on the gate stack 113 and RSD regions 115. Exemplary, but non-limiting, metals that can be deposited include nickel, platinum or titanium, and the metal thickness is preferably several Å, in a range of 6 Å to about 8 Å in some embodiments. The anneal process thus produces one of NiSi, PtSi or TiSi for the silicide contacts. Metal vias 119 are formed over RSD contacts 117 over source and drain regions using a liftoff or damascene process. Suitable contact metals to form the vias 119 include, for example, tungsten, copper or aluminum.

Figure 7:
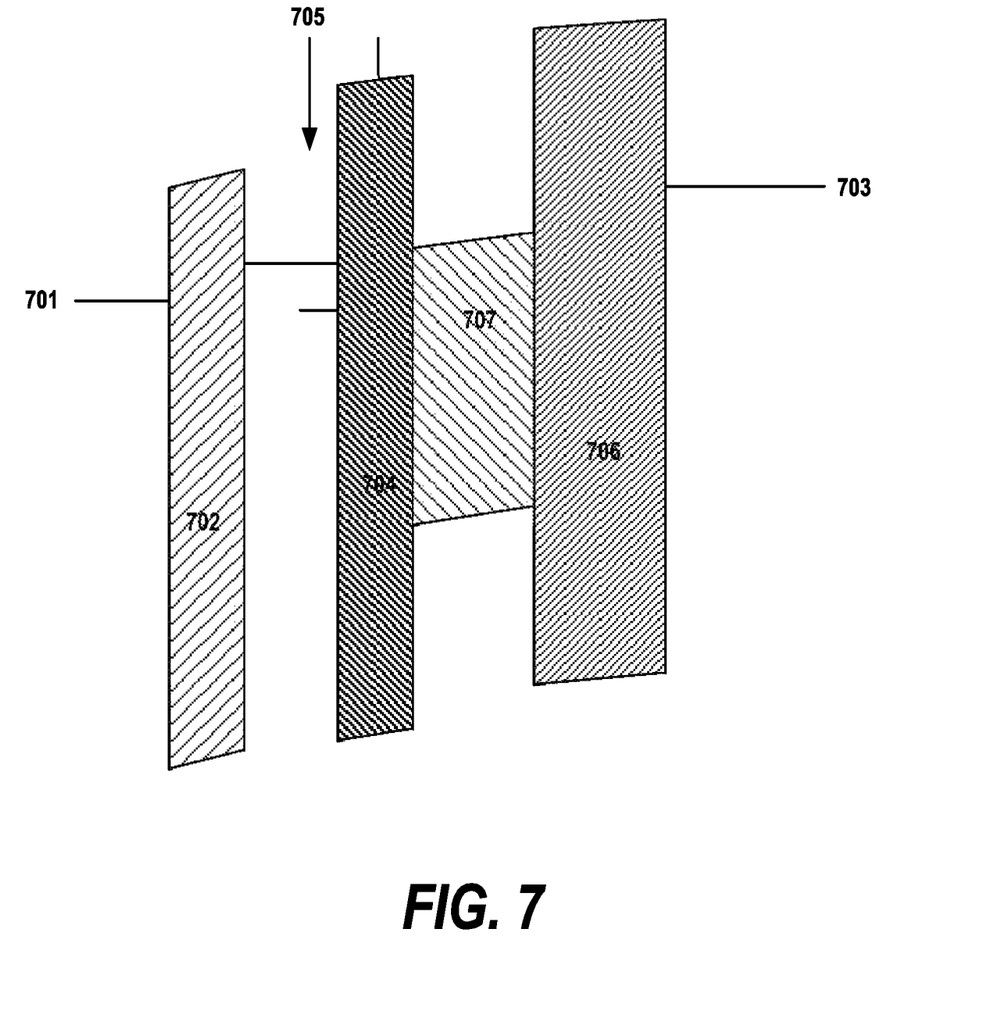
FIG. 7 is a schematic representation with valence, conduction bands and Fermi levels of an FDSOI device built according to embodiments of the invention in a normal operating mode.

FIG. 7 is a schematic band diagram representation of an exemplar FDSOI device in the normal operating mode. The figure depicts valence, conduction bands and Fermi levels of an FDSOI device built according to embodiments of the invention. The Fermi level can be considered to be a hypothetical energy level of an electron. The valence band and conduction band are the bands closest to the Fermi level and thus determine the electrical conductivity of a solid such as a semiconductor. The valence band is the highest range of electron energies in which electrons are normally present at absolute zero temperature, while the conduction band is the lowest range of vacant electronic states. On a graph of the electronic band structure of a material, the valence band is located below the Fermi level, while the conduction band is located above it. The Fermi level is set by the device's electrodes. So that one end of the Fermi level is set by the voltage level of the gate 701 and the voltage level of the backgate 703 sets the other end of the Fermi level. Each of the parallelograms 702, 704, 707 and 706 represent the limits of band structure of an FDSOI device built according to the principles of the invention. The limits of the conduction band are represented by the upper boundary, and the limits of the valence band by the lower boundary of a respective parallelogram for a respective layer of the device. Parallelogram 702 represents the energy levels of the gate structure; parallelogram 704 represents the energy levels of the top portion of the BOX layer. Parallelogram 706 represents the energy levels of the bottom portion of the BOX layer. The Fermi level of the silicon body is shown by the line 705, and the energy levels of the trapping layer are represented by parallelogram 707.

As can be seen in the figure, the Fermi levels of the top (line 701) and bottom (line 703) gate are modulated by only a moderate degree, just enough to turn the transistor off and on. The presence of a charge trapping layer in the BOX layer is depicted as a region 707 with a smaller bandgap, although it may as readily have states located within the dielectric bandgap 704.

The meaning of the numerals is the same in FIGS. 8A and 8B and FIGS. 9A and 9B as is discussed in reference to FIG. 7. ((Please correct as needed, but I was trying to interpret the meaning of the band diagram))

Figure 8A:
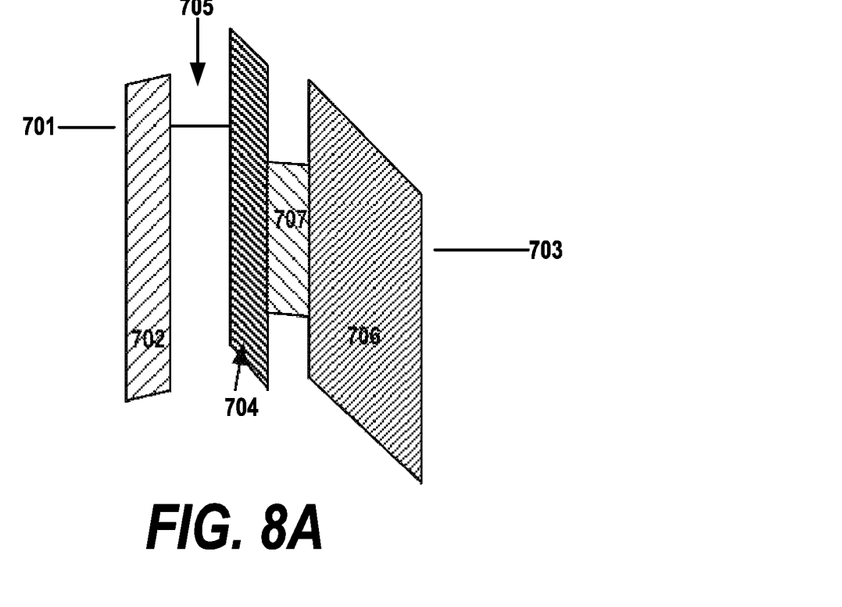
FIGS. 8A-8B are schematic representations with valence, conduction bands and Fermi levels of FDSOI devices built according to embodiments of the invention in an electron writing mode and an electron written mode respectively.

FIG. 8A is a schematic representation of the bands when writing electrons into the charge-trapping layer. A large positive potential is applied to the backgate relative to the silicon body, and electrons tunnel into the trapping layer, either directly, or through Fowler-Nordheim injection.

Figure 8B:
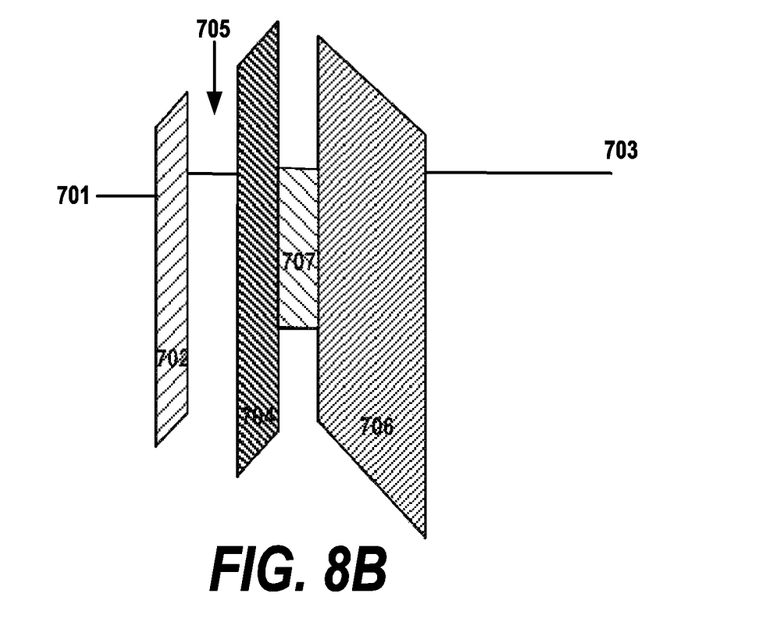

FIG. 8B is a schematic representation of the bands during normal operation after the electrons have been trapped in the charge trapping layer. The figure shows a band diagram with only moderate potentials applied, but with the negative charge trapped. For this case, the threshold voltage of the transistor is more positive than that represented in FIG. 7 prior to charge trapping.

Figure 9A:
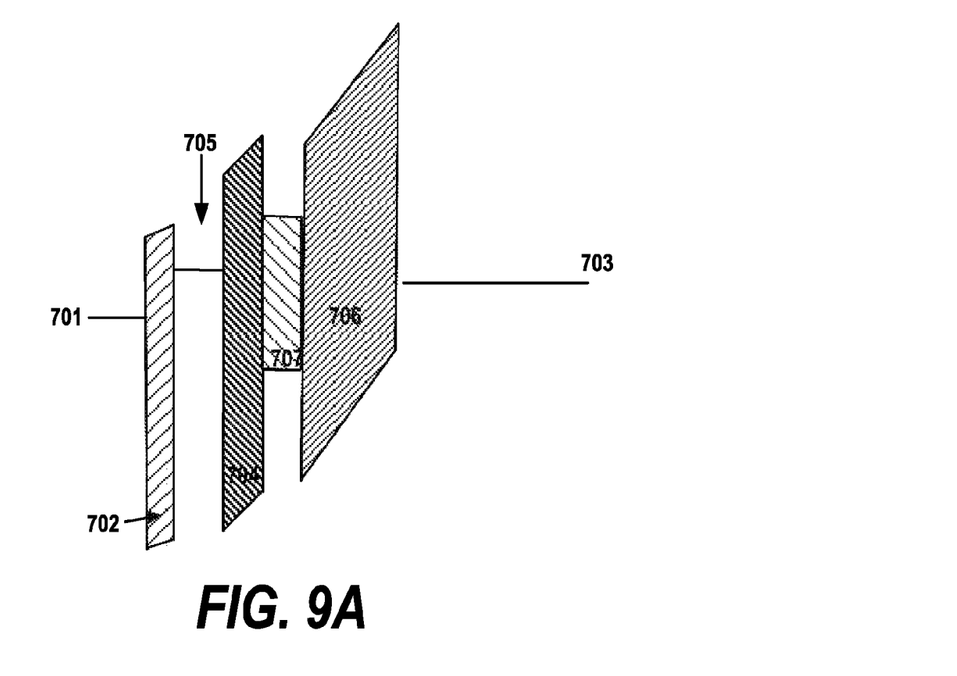
FIGS. 9A-9B are schematic representation with valence, conduction bands and Fermi levels of FDSOI devices built according to embodiments of the invention in a hole writing mode and a hole written mode respectively.

FIG. 9A is a schematic representation of the bands when writing holes into the charge-trapping layer. A large negative potential is applied to the backgate relative to the silicon body, and electrons tunnel out of the trapping layer, either directly, or by Fowler-Nordheim injection.

Figure 9B:
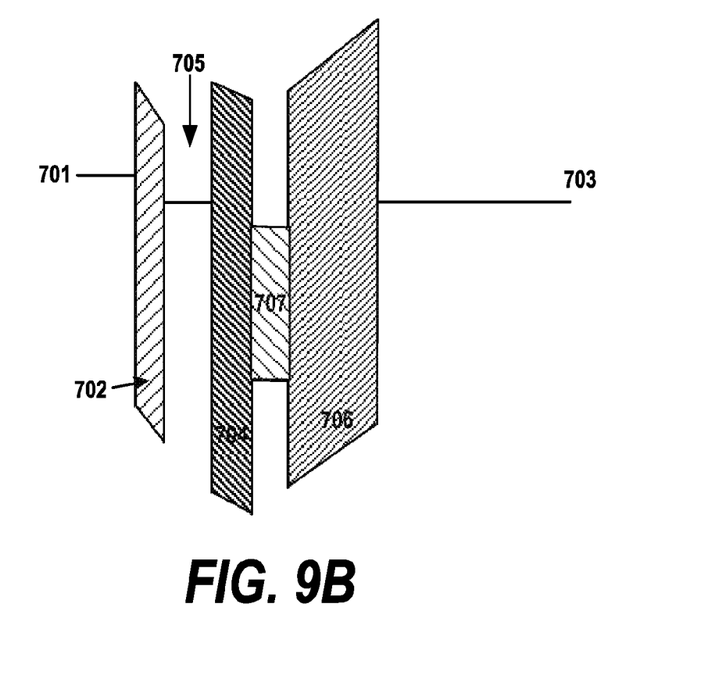

FIG. 9B is a schematic representation of the bands during normal operation, with only moderate potentials applied, but with positive charge trapped. The threshold voltage of the transistor in this case is more negative than that represented in FIG. 7.

Figure 10:
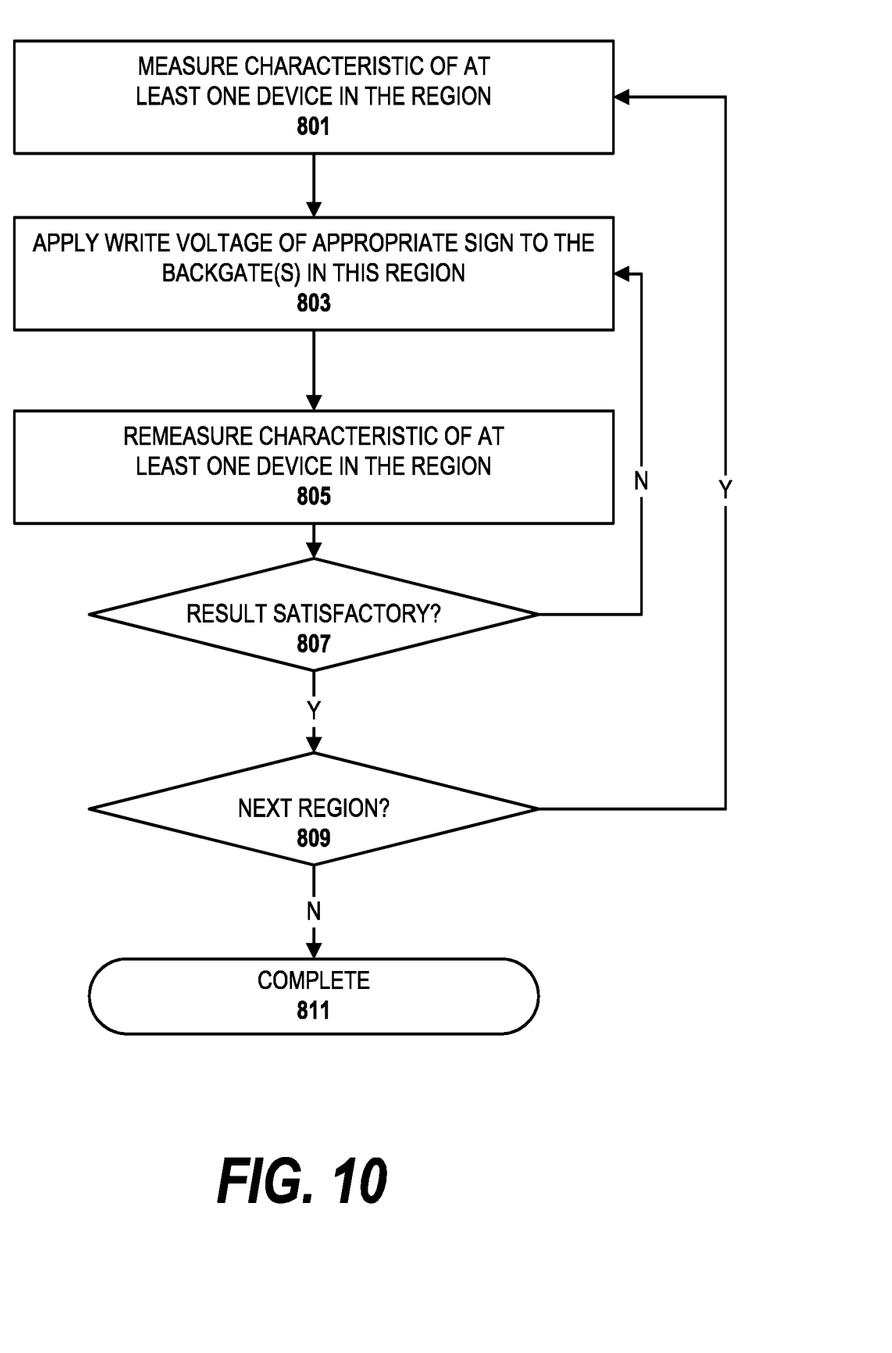
FIG. 10 is a flow diagram of a process for tuning a FDSOI device built according to an embodiment of the invention by trapping charge in the charge trapping layer.

FIG. 10 is a flow-chart showing a method by which the threshold voltage in a region may be adjusted for the desired characteristics through the charge-trapping mechanism. In step 801, the process begins by measuring at least one electrical characteristic of at least one device in a region to be adjusted during a test and measurement process to determine a measured value of the characteristic. Examples of electrical characteristics which could be tested include leakage, performance and power ((please provide several characteristics)). A single device can be selected as a representative device of the region of the chip to be adjusted, a sampling of devices in the region or the operation of a functional unit in the region can be tested. Next, in step 803, having determined that the tested characteristic needs to be adjusted in some way, an electron trapping or a hole trapping voltage is applied to the backgates of the devices in the tested region of the chip to adjust the characteristic, for example a voltage of about 8 to 20V and preferably about 10V; positive for electron trapping and negative for hole trapping. The amount and type of charge selected to be trapped is in accordance with the measured value of the characteristic. With greater voltages and time, more electrons or holes will tunnel into the charge trapping layer. In step 805, the tested characteristic is remeasured for the device in the region to produce a second measured value. A determination is made, step 807, whether the characteristic has been adjusted satisfactorily, e.g., the second measured value is within a predetermined desired range of values. If not, the process returns to step 803 where an electron trapping or a hole trapping voltage is applied again according to the second measured value. If the result is satisfactory, the process proceeds to step 809, where the next region is tested and the process returns to step 801. Or, if all regions of the chip have been tested and adjusted, the process ends, step 811.

In a normal FDSOI device, the typical potentials are that a normal operating Vdd voltage ranges from 0.7-1V and a normal back-bias operating voltage ranges from −2V to 2V. Using the present invention, preferred embodiments use electron trapping and hole trapping voltage levels as follows. When writing electrons into the trapping layer, the backgate silicon potential is set so as to tunnel electrons from the thin silicon into the charge trapping layer, say on the order of +9V. When removing electrons (i.e. writing holes) into the trapping layer, the backgate silicon potential is set so as to tunnel electrons out of the charge trapping layer into the thin silicon, say on the order of −9V.

While the present invention is similar to standard FDSOI in that backgate wells are provided beneath the BOX layer and a planar FDSOI transistor is situated above the BOX layer, the operation of transistors built according to the invention is much more flexible because of the addition of the charge trapping layer. Through the above operations, the charge state in the trapping layer is set so as to obtain the desired threshold voltage in the overlying transistor(s). A measurement and feedback algorithm may be used to adjust the electron trapping/hole trapping until the proper level is obtained. In addition to being able to fine tune the threshold voltage, the invention is compatible with FDSOI devices built in a standard manner or by simply operating a FDSOI device built according to the invention, i.e. with a charge trapping layer, but without introducing a charge into the charge trapping layer and relying on the normal doping of the backgate well to modulate the threshold voltage.

In standard FDSOI devices, the threshold voltage-setting can largely be accomplished by backgate doping, and thus, two Vts available by different backgate doping (N vs P). Variations in individual devices due to process deviations can be tuned by establishing a backbias to 'center' the threshold voltage (Vt). In the prior art, this backbias voltage is generated on-chip using pump circuits allowing the circuit to control Vt circuit-wide or chip-wide with variable backgate bias. In the present invention, region(s) or entire chip of arbitrary size can be established with selected Vt by combining a backgate workfunction with a selected trapped charge in the BOX layer. This allows the invention to tune out process variations by trapping charge, with no pump circuit needed. Using the charge layer allows embodiments of the invention to re-center region(s) or entire chips into the range of required voltage.

Using electron trapping/hole trapping (i.e. electron and hole trapping) operations, the charge state in the trapping layer is set so as to obtain the desired threshold voltage in the overlying transistor(s). A test device measurement and feedback algorithm may be used to adjust the electron trapping/hole trapping until the proper level is obtained. The 'proper' level is determined by desired chip parameters such as leakage and performance. In the preferred embodiment, this operation is done at the completion of the chip manufacturing process when the electron trapping/hole trapping voltages are readily available.

During electron trapping and hole trapping mode, the backgate and ground Vdd voltage in the selected circuit are controlled so as to provide the charge flow into and out of the BOX trapping layer. During normal operation of the FDSOI device, the backgate potential may be set to ground or Vdd, as convenient, and ground and Vdd voltages are applied normally to the active circuits.

In this invention, the pump circuits of the prior art, which expend power and require valuable chip area, are not required in embodiments of the invention as the effective backgate voltage may be permanently or semi-permanently established in selected regions of the chip. However, in other embodiments, the charge trapping layer is used in conjunction with a pump circuit to allow more flexible operation. In those embodiments of the invention using a pump voltage, the operating center point for pump voltages may be adjusted for improved operation. Additional threshold voltages may be provided by using front gate and backgate work functions.

Figure 11:
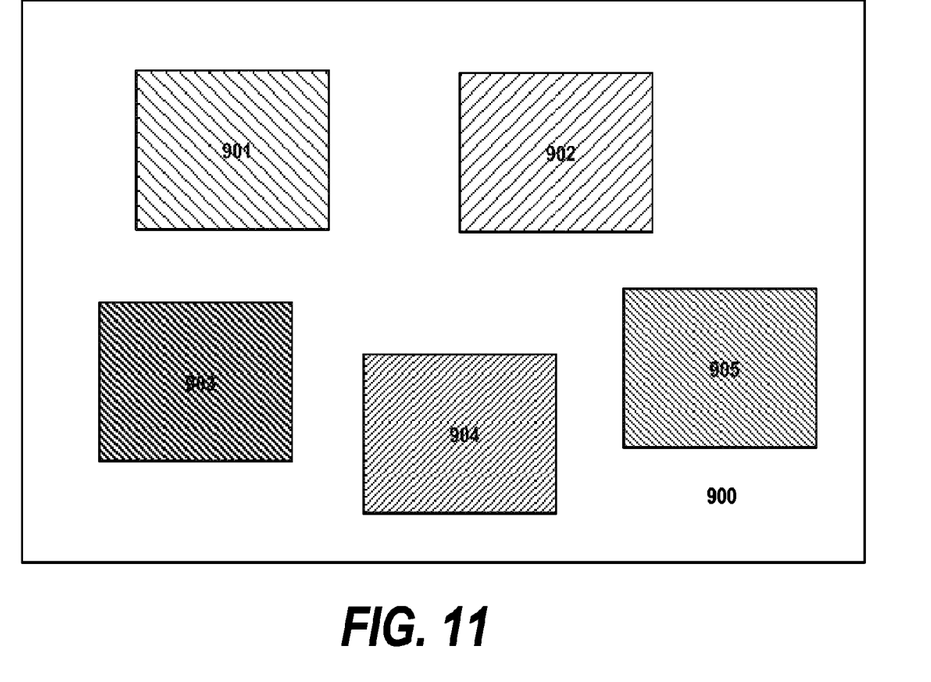
FIG. 11 is a top view diagram generally depicting different areas of an integrated circuit having regions with arbitrary voltage thresholds (Vt) established by embodiments of the invention.

FIG. 11 is a top view diagram generally depicting different areas of an integrated circuit having regions with different voltage thresholds established by embodiments of the invention. In area 901, the FDSOI devices are doped with a p-type backgate well, but without any charge in the charge trapping layer. Devices in area 901 have a first voltage threshold. In area 902, the FDSOI device have n-type backgate wells and no charge in the charge trapping layers. Devices in area 902 have a second voltage threshold different from the first voltage threshold. The devices in areas 901 and 903 have voltage thresholds similar to devices in the prior art. In area 903, the FDSOI devices have p-type doped backgate wells, and their charge trapping layers have a first amount of charge. Devices in area 903 have a third voltage threshold. In area 904, the FDSOI devices have p-type doped backgate wells, and their charge trapping layers have a second amount of charge greater than the first amount of charge. In area 905, the FDSOI devices have n-type doped backgate wells, and their charge trapping layers have a first amount of charge. Devices in areas 904 and 905 respectively have a fourth and a fifth voltage threshold. FIG. 11 is intended to show that an integrated circuit fabricated according to the present invention can have circuits with a plurality of voltage thresholds, coexistent on the same substrate, using the same process steps to fabricate the devices, by manipulating the doping of the backgate wells and the charging of the charge trapping layers.

The present invention offers many advantages over the prior art. The benefits of backgate biasing in FDSOI are known as it can dynamically alter the threshold voltage, speeding up or reducing the leakage of circuits on the fly. Backgate biasing can be used to adjust for process variations and fine-tune operation, especially in SRAMs. However, it the prior art, backgate biasing suffered from the requirement to actively provide the requisite voltages to the wells, which requires pump circuits which expend power and area.

In this invention, a structure and method is disclosed whereby the effective backgate voltage may be permanently or semi-permanently established in selected regions of the chip. The present invention eliminates the requirement for a pump voltage. In preferred embodiments of the invention, pump circuits are not used. However, in those embodiments of the invention using a pump circuit and a pump voltage, the operating center point for pump voltages may be adjusted for improved operation. Additional threshold voltages using the present invention may be provided beyond those which are available in the prior art. Other options such as front gate and backgate work functions can be used in embodiments of the invention.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A fully depleted silicon on insulator (FDSOI) device comprising:
    a buried oxide layer on a semiconductor substrate;
    an alumina charge trapping layer formed directly in the buried oxide layer;
    a backgate well in the semiconductor substrate under the charge trapping layer; and
    a device structure including a gate structure, source and drain regions disposed over the buried oxide layer,
    wherein a threshold voltage of the device is partially established by a charge trapped in the charge trapping layer.

2. The device as recited in claim 1, further comprising a plurality of regions in the semiconductor substrate, wherein each region has a set of FDSOI devices configured as recited in claim 1, and wherein a first set of FDSOI devices in a first region of the semiconductor substrate have a first type of and amount of charge and a second set of FDSOI devices in a second region of the substrate have a second type of and amount of charge.

3. The device as recited in claim 2, wherein the first type of charge is a negative charge and the second type of charge is a positive charge.

4. The device as recited in claim 1, further comprising a plurality of regions in the semiconductor substrate, wherein each region has a set of FDSOI devices configured as recited in claim 1, and wherein a first set of FDSOI devices in a first region of the semiconductor substrate have a first type of charge trapped in respective charge trapping layers and an n-type dopant in respective backgate well areas and a second set of FDSOI devices in a second region of the semiconductor substrate have the first type of charge trapped in respective charge trapping layers and a p-type dopant in respective backgate well areas, wherein a threshold voltage of a respective device is dependent on the charge trapped in the charge trapping layer and the dopant in the backgate well area.

5. The device as recited in claim 1, further comprising a shallow trench isolation area which extends through the buried oxide layer below the level of the charge trapping layer.

6. The device as recited in claim 1, wherein an amount of charge trapped in the charge trapping layer is according to a measured value of an electrical characteristic.

7. A fully depleted silicon on insulator (FDSOI) device comprising:
- a buried oxide layer on a semiconductor substrate;
- a charge trapping layer formed directly in the buried oxide layer, wherein the charge trapping layer includes a different material than the buried oxide layer;
- a backgate well in the semiconductor substrate under the charge trapping layer; and
- a device structure including a gate structure, source and drain regions disposed over the buried oxide layer,
- wherein a threshold voltage of the device is partially established by a charge trapped in the charge trapping layer, and
- wherein the charge trapping layer in the buried oxide layer is electrically isolated from an adjacent charge trapping layer in the buried oxide layer.

8. The device as recited in claim 7, wherein the charge trapping layer in the buried oxide layer is electrically isolated from the adjacent charge trapping layer by an oxide material containing no charge trapping layer.

9. The device as recited in claim 7, wherein the charge trapping layer is an implant-damaged layer in the buried oxide layer.

10. The device as recited in claim 7, wherein the charge trapping layer is a layer selected from the group of silicon nodules, silicon nitride, and alumina.

11. The device as recited in claim 7, further comprising a plurality of regions in the semiconductor substrate, wherein each region has a set of FDSOI devices configured as recited in claim 1, and wherein a first set of FDSOI devices in a first region of the semiconductor substrate have a first type of and amount of charge and a second set of FDSOI devices in a second region of the substrate have a second type of and amount of charge.

12. The device as recited in claim 11, wherein the first type of charge is a negative charge and the second type of charge is a positive charge.

13. The device as recited in claim 7, further comprising a plurality of regions in the semiconductor substrate, wherein each region has a set of FDSOI devices configured as recited in claim 1, and wherein a first set of FDSOI devices in a first region of the semiconductor substrate have a first type of charge trapped in respective charge trapping layers and an n-type dopant in respective backgate well areas and a second set of FDSOI devices in a second region of the semiconductor substrate have the first type of charge trapped in respective charge trapping layers and a p-type dopant in respective backgate well areas, wherein a threshold voltage of a respective device is dependent on the charge trapped in the charge trapping layer and the dopant in the backgate well area.

14. The device as recited in claim 7, further comprising a shallow trench isolation area which extends through the buried oxide layer below the level of the charge trapping layer.

15. The device as recited in claim 7, wherein an amount of charge trapped in the charge trapping layer is according to a measured value of an electrical characteristic.

* * * * *